United States Patent
Stellari et al.

(10) Patent No.: US 8,115,170 B2
(45) Date of Patent: Feb. 14, 2012

(54) METHOD AND APPARATUS FOR CREATING TIME-RESOLVED EMISSION IMAGES OF INTEGRATED CIRCUITS USING A SINGLE-POINT SINGLE-PHOTON DETECTOR AND A SCANNING SYSTEM

(75) Inventors: Franco Stellari, Waldwick, NJ (US); Alberto Tosi, Invorio (IT); Franco Zappa, Milan (IT); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 893 days.

(21) Appl. No.: 11/621,217

(22) Filed: Jan. 9, 2007

(65) Prior Publication Data

US 2008/0164414 A1 Jul. 10, 2008

(51) Int. Cl.
*G01N 21/01* (2006.01)
*G01N 21/17* (2006.01)
*G01N 21/64* (2006.01)

(52) U.S. Cl. ............................ 250/339.06; 356/237.1
(58) Field of Classification Search ............ 250/339.06, 250/339.11, 339.14; 356/497, 237.1; 324/752, 324/158.1
See application file for complete search history.

(56) References Cited

U.S. PATENT DOCUMENTS

| | | | | |
|---|---|---|---|---|
| 5,012,100 | A * | 4/1991 | Plies et al. | 250/342 |
| 5,940,545 | A | 8/1999 | Kash et al. | |
| 7,113,630 | B2 * | 9/2006 | Dajee et al. | 382/151 |
| 2005/0048539 | A1 * | 3/2005 | Hyman et al. | 435/6 |
| 2005/0160331 | A1 * | 7/2005 | Wilsher | 714/700 |
| 2006/0220664 | A1 * | 10/2006 | Stellari et al. | 324/752 |
| 2007/0011519 | A1 * | 1/2007 | Takeda et al. | 714/724 |
| 2008/0218750 | A1 * | 9/2008 | Desplats | 356/237.1 |
| 2009/0116707 | A1 * | 5/2009 | Sutko et al. | 382/128 |

OTHER PUBLICATIONS

Tsang, JC, JA Kash, and DP Vallett. "Picosecond Imaging Circuit Analysis". IBM Journal of Research and Development (44) 4: Jul. 2000.*
Dajee, G, N Goldblatt, T Lundquist, S Kasapi, and K Wilsher. "Practical, Non-invasive Optical Probing for Flip-Chip Devices." Proceedings from Int. Test Conf. 2001: p. 433-442.*
Stallari, F P. Song, A. J. Weger, and M. K. Manus. "Time-Resolved Optical Measurements from 0.13μm CMOS Technology Microprocessor using a Superconducting Single-Photon Detector." Proceedings from the 29th ISTFA: p. 40-44.*
Duncan et al. (2004). "Multidimensional TCSPC Fluorescence Lifetime Imaging Microscopy (FLIM) to Detect FRET in Cells." J Microsc. 215 (Pt 1): 1-12.*
Mohan et al. (2008). "Photon-Counting Optical Coherence-Domain Reflectometry Using SSPD." Optics Express (16) 22: 18118-30.*

(Continued)

*Primary Examiner* — David Porta
*Assistant Examiner* — Casey Bryant
(74) *Attorney, Agent, or Firm* — Tutunjian & Bitetto, P.C.; Anne V. Dougherty (57) ABSTRACT

A Scanning Time-Resolved Emission (S-TRE) microscope or system includes an optical system configured to collect light from emissions of light generated by a device under test (DUT). A scanning system is configured to permit the emissions of light to be collected from positions across the DUT in accordance with a scan pattern. A timing photodetector is configured to detect a single photon or photons of the emissions of light from the particular positions across the DUT such that the emissions of light are correlated to the positions to create a time-dependent map of the emissions of light across the DUT.

34 Claims, 6 Drawing Sheets

OTHER PUBLICATIONS

Becker et al. (2001). "Picosecond Fluorescence Lifetime Microscopy by TCSPC Imaging". SPIE BIOS 2001: Multiphoton Microscopy in the Biomedical Sciences: p. 1-6.*

William Lo et al., "Next-Generation Optical Probing Tools for Design Debug of High Speed Integrated Circuits", Proc. from the 28th Int'l Symposium for Testing and Failure Analysis: Nov. 2002, Phoenix, AZ; pp. 753-762.

Stas Polonsky, et al., "Picosecond Imaging Circuit Analysis of Leakage Currents in CMOS Circuits", Proc. from the 28th Int'l Symposium for Testing and Failure Analysis: Nov. 2002, Phoenix, AZ; pp. 387-390.

Jim Vickers, et al., "Prospects of Time-Resolved Photon Emission as a Debug Tool", Proc. from the 28th Int'l Symposium for Testing and Failure Analysis: Nov. 2002, Phoenix, AZ; pp. 645-653.

J. A. Kash et al., Dynamic Internal Testing of CMOS Circuits Using Hot Luminescence IEEE Electron Device Lietters, vol. 18, No. 7, Jul. 1997; pp. 330-332.

Stas Polonsky et al., "Time-Resolved Measurements of Self-Heating in SOI and Strained-Silicon MOSFETs Using Photon Emission Microscopy", IEEE Electron Device Letters, vol. 24, No. 4, Apr. 2004; pp. 208-210.

Franco Stellari et al., "Testing and Diagnostic of CMOS Circuits Using Light Emission from Off-State Leakage Current", IEEE Trans on Electron Devices, vol. 51, No. 9, Sep. 2004; pp. 1455-1462.

Franco Stellari et al., "Testing of Ultra Low Voltage VLSI Chips using the Superconducting Single-Photon Detector (SSPD)", Elsevier, Microelectronics Reliability 44; 2004; pp. 1663-1668.

J. Kolzer, et al., "Quantitative Emission Microscopy", J. Appl. Phys. 71 (110, Jun. 1, 1992 pp. R23-R41.

Wolfgang Becker et al., "Lifetime Imaging Techniques for Optical Microscopy", Becker & Hickl GmbH, Berlin, Germany, Feb. 2003; www.becker-hickl.com; pp. 1-41.

Product Manual, "TCSPC Laser Scanning Microscopy: Upgrading laser Scanning Microscopes with the SPC-830 and SPC-730 TCSPC lifetime imaging modules", Becker & Hickl GmbH, Berlin Germany, Feb. 2003; www.becker-hickl.com; pp. 1-37.

Product Manual, "TCSPC adds a new dimension to 3D laser scanning microscopy", Becker & Hickl GmbH, Berlin Germany Feb. 2000; pp. 1-6.

Prod Manual Leica Microsystems, "Picosecond Laser Scanning Microscopy Upgrade Your Leica TCS SP-2 for Lifetime Imaging", Becker & Hick! GmbH, Berlin Germany; May 2001; pp. 1-4.

Prod. Manual Zeiss, "Add one more Dimension to 3D Imaging", Becker & Hickl GmbH, Berlin, Germany, Jul. 2001; pp. 1-5.

* cited by examiner

METHOD AND APPARATUS FOR CREATING TIME-RESOLVED EMISSION IMAGES OF INTEGRATED CIRCUITS USING A SINGLE-POINT SINGLE-PHOTON DETECTOR AND A SCANNING SYSTEM

BACKGROUND

1. Technical Field

The present invention relates to imaging technology and more particularly to systems and methods for photon detection for use in integrated circuit analysis.

2. Description of the Related Art

Hot-carrier photon emission from very large scale integration (VLSI) circuits has been employed for localizing and identifying failures in circuits. With the introduction of Emission Microscopy, hot-carrier photon emission soon became an essential instrument for physical failure analysis by localizing hot-spot emission, shorts, non-uniform quiescence/stand-by current of the chip (IDDQ), etc. More advanced extensions have also been added to this technique in recent years, based, for example, on the detection of the Light Emission due to Off-State Leakage Current (LEOSLC): circuit logic states mapping, power grid drop calculation, circuit internal temperature and gate self heating measurements, etc.

In 1995, the concept of Picosecond Imaging for Circuit Analysis (PICA), also called Time-Resolved Emission (TRE), was introduced and used. This technique permits the observation in time of the faint near-infrared (NIR) light pulses emitted by hot carriers during the switching transitions of complementary metal oxide semiconductor (CMOS) transistors. From the optical waveforms, it is possible to extract propagation delays, signal skews and other timing problems in a non-invasive and very effective way. These features dictated the immediate widespread adoption of PICA by the testing and diagnostic community. Emissions can be measured in a static way (integrated in time) or dynamically (timing waveforms).

Nowadays, the continuous trend of the modern semiconductor industry towards smaller devices and lower supply voltages is causing significant changes in the intensity and spectrum shift of the light emitted by present CMOS generation. In particular, the progressive shift of the spectral distribution of emitted light towards longer wavelengths pushed for the development of innovative photodetectors.

Although promising, all prototypes of new imaging photodetectors so far developed have significant disadvantages (such as high noise, hot-spots, non-uniformity, high time jitter) that precluded their adoption for PICA measurements. In fact, manufacturing even single pixel photodetectors with low noise and low jitter is complicated and leads to a very low yield, and high cost. The manufacturing technology does not seem mature enough to yield arrays of such photodetectors to create a performing imaging photodetector.

SUMMARY

The evolution and improvement of PICA capabilities may be influenced by different photodetectors adapted to measure the arrival time of the photons compared to a reference signal (trigger). Some detectors like the MEPSICRON S-25™ photo-multiplier tube (PMT) may be employed because of their capability of measuring the spatial coordinates of the position at which the photon arrives in addition to the instant in time. This permits the creation of images in time (movies) of the evolution of the light of the chip, thus extremely simplifying the interpretation of data.

However, the low sensitivity of such photodetectors in the Near-Infrared (NIR) region of the emission spectrum mostly limited the technique to the observation of light pulses coming from field effect transistors (FETs). Moreover, the emission from the p-type FET (p-FET) is more than one order of magnitude weaker than n-type FETS (n-FETs) and shifted towards longer wavelengths, i.e. lower photon energy. As a consequence, the delay and skews can be calculated only between logic gates having the same signal phase, and in particular in correspondence to the falling edge of the logic gate output, when the strongest emission from n-FETs occurs.

Two photodetectors that demonstrate significantly better Quantum Efficiency (QE) in the NIR region of the spectrum, lower noise and lower time jitter are the Superconducting Single Photon Detector (SSPD) and the InGaAs Single Photon Avalanche Diode (SPAD). Although all these photodetectors offer only single-point detection capability as opposed to the imaging capability of the S-25 PMT, they permit a significant reduction of the acquisition time for the light pulses produced by n-FETs (e.g., a reduction of more than 1,000,000 times). Moreover the photodetectors permit the observation of the light pulses emitted by the weaker p-FETs (corresponding to the rising edge of a logic gate output signal). This simplifies and extends the capabilities of Picosecond Image for Circuit Analysis (PICA) techniques allowing the evaluation of signal pulse width, duty cycle, as well as the delay and skews between signals with different phases.

The loss of imaging capability is a significant limiting factor for various reasons. In particular, time resolved imaging of the emission permits measurement of several hundreds of devices at the same time during a single acquisition, eases the interpretation of the data collected, allows the experienced user to pinpoint areas of interest for the measurements, permits failures in unexpected areas to be visible in an image, simplifies the development of test patterns and greatly simplifies alignment to the layout. For all these reasons, significant effort is devoted to develop new imaging and timing photodetectors with improved NIR sensitivity: e.g. InGaAs photo-cathodes or arrays of single pixel photodetectors are needed.

In accordance with present embodiments, a scanning time-resolved emission (S-TRE) microscope or system is provided which includes an optical system configured to collect light from spontaneous or other emissions of light from a device under test (DUT). A scanning system is configured to permit the emissions of light to be collected from positions across the DUT in accordance with a scan pattern. A timing photodetector (a photodetector with high timing resolution) is configured to detect a single photon or photons of the emissions of light from the particular positions across the DUT such that the emissions of light are correlated to the positions to create a time-dependent imaging map of the emissions of light across the DUT.

Another Scanning Time-Resolved Emission (S-TRE) microscope in accordance with the present principles includes an optical system configured to collect light from spontaneous emissions of light from a device under test (DUT). A scanning system is configured to permit the spontaneous emissions of light to be collected from particular positions across the DUT in accordance with a scan pattern. A triggering signal is generated from one of the DUT and an external timing generator and indicates an instant when an event occurs on the DUT. A timing photodetector is configured to detect a single photon or photons of the spontaneous emissions of light from particular positions across the DUT such that the spontaneous emissions of light are correlated to the positions. A time correlated single photon counting (TCSPC) system is configured to receive the particular position information from the scanning system and correlate the position to a detected photon or photons, wherein the TCSPC system receives a photon arrival signal from the photodetector and the trigger signal and compute a delay between the photon arrival signal and the trigger signal to determine a time for the occurrence of the spontaneous light emission.

A laser scanning microscope is adapted to be a Scanning Time-Resolved Emission (S-TRE) microscope and includes a navigation mode which includes an active laser source, a first optical system configured to direct light to a device under test (DUT), collect and redirect light from excited emissions of light from the device under test (DUT), a scanning system configured to position the first optical system to permit the excited emissions of light to be collected from particular positions across the DUT, a static or slow photodetector (e.g., a photodetector with a limited bandwidth which is not able to precisely determine the time instant at which the photon is detected) configured to detect the excited emissions of light from the particular positions across the DUT to determine an initial position on the DUT and a moveable mirror configured to be out of an optical path of the laser beam during the navigation mode. A Picosecond Imaging for Circuit Analysis (PICA) mode includes the moveable mirror positioned in the optical path to redirect emissions generated by the DUT, and a second optical system configured to collect light from the emissions of light from the moveable mirror. The scanning system is configured to position the second optical system to permit the emissions of light to be collected from particular positions across the DUT in accordance with a scan pattern. A timing photodetector is configured to detect a single photon or photons of the emissions of light from the particular positions across the DUT such that the spontaneous emissions of light are correlated to the positions to create an imaging map of the emissions of light across the DUT.

A method for Picosecond Imaging for Circuit Analysis (PICA) using a Scanning Time-Resolved Emission (S-TRE) microscope includes detecting light emissions from a device under test (DUT) at a position using a timing photodetector capable of single photon detection, correlating the position to the light emissions detected at that position; and storing correlated position and spontaneous light emission counts in a record.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with present principles, methods and systems are presented to regain imaging capability for Picosecond Imaging for Circuit Analysis (PICA) while still using high-performance highly-optimized single pixel photodetectors. Instead of developing a photodetector with imaging capability but compromised performance, the focus is shifted to the use of single pixel photodetectors in a different optical system. This permits for the photodetector manufacturers to fully exploit the capability of their technology to maximize the single pixel performance, leaving the task of imaging to the optical system.

A single pixel or single point detector is a photodetector which is unable to spatially separate a photon inside the field of view or collection area. All the photons collected from a certain area/volume are spatially associated with a point.

Embodiments of the present invention can take the form of a hardware embodiment, or an embodiment including both hardware and software elements. In a preferred embodiment, the present invention is implemented in a combination of hardware and software elements. The software includes but is not limited to firmware, resident software, microcode, etc.

Furthermore, aspects of the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
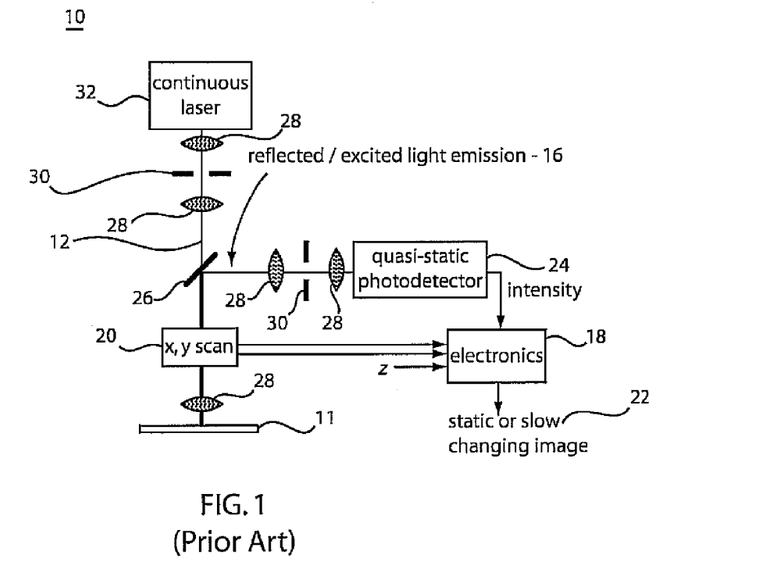
FIG. 1 is a schematic diagram of a Confocal Laser Scanning Microscope (C-LSM)

Referring now to the drawings in which like numerals represent the same or similar elements and initially to FIG. 1, a Confocal Laser Scanning Microscope (C-LSM) 10 (schematically depicted) works by scanning a laser beam 12 on a surface of a device under test (DUT) 11 and measures reflected light intensity 16 from different areas of a circuit formed on DUT 11. The intensity of the reflected light is measured using a photodetector 24, which may include a PIN diode, avalanche photodiode (APD) or photo-multiplier tube (PMT). An intensity map may be generated using electronics 18 which receives position information from a scanning device 20 (x, y coordinates), and maps intensity versus position to create an image 22 that can be used for navigation and inspection of the device under test (DUT) 11. The map represents a physical map of the surface and its features, and is not employed in anyway to measure circuit performance or perform circuit analysis.

It is to be understood that mirrors (e.g., dichroic) 26, optics 28 (e.g., lenses) and pin holes 30 may be configured to direct light from a laser source 32 to the DUT 11 and from the DUT 11 to the photodetector 24 to map physical attributes of the DUT 11.

Figure 2:
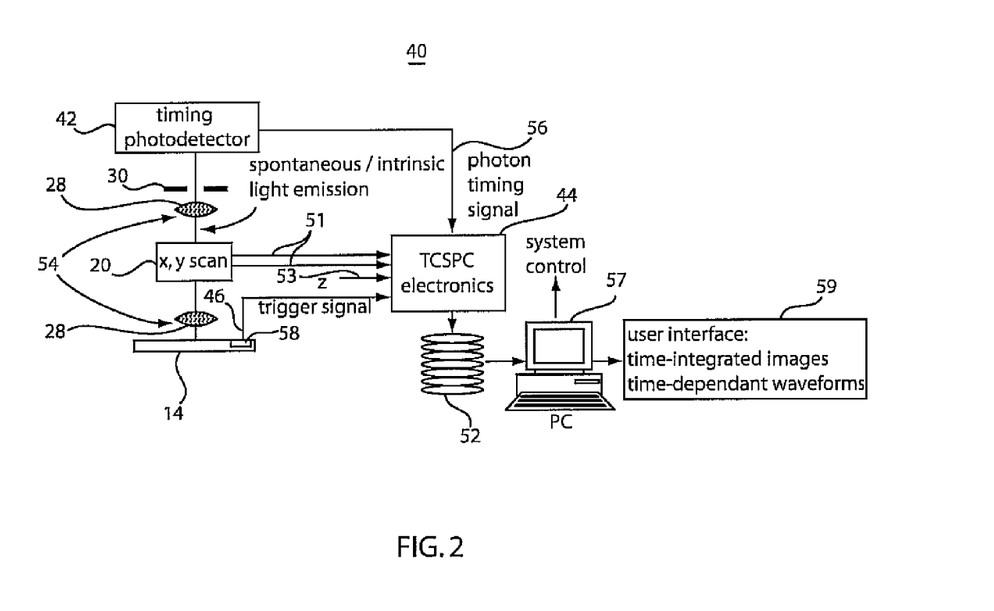
FIG. 2 is a schematic diagram of a Scanning Time-Resolved Emission (S-TRE) measurement system in accordance with one embodiment.

Referring to FIG. 2, in accordance with present principles, a scanning system 40 is employed for acquiring spontaneous light emission (not the laser reflections) from different areas of a DUT 14 and focuses the photons onto a timing photodetector 42 that is capable of precisely measuring the arrival time of single-photon on a picosecond time-scale. This may be referred to as a Scanning Time-Resolved Emission (S-TRE) measurement system 40 with enhanced capabilities for enabling PICA for modern and future semiconductor technologies. It should be understood that there may be applications where excited emissions may be measured in addition to or instead of the spontaneous emissions. System 40 permits imaging capability for PICA by using a high-performance single point/pixel photodetector 42, among other things.

Time-Correlated Single-Photon Counting (TCSPC) electronics 44 associated with the optical system 40 receives a photon arrival signal 56 from the photodetector 42, a trigger signal 46 (reference signal) from the DUT 14 or a timing generator (not shown), and the actual XY (51) (and Z (53)) position from a scanner 20 at the time of the photon detection. A database 52 stores the delay between the photon arrival time and the trigger signal, along with the pixel coordinates in the image.

In one embodiment, the S-TRE system 40 includes an optical system 54 to collect light from a DUT and focus it onto a photodetector 42. The optical system 54 may include one or more lenses 28, pinholes 30 and mirrors (not shown), as needed. A scanning system 20 permits movement over the collection area across the DUT 14 to collect spontaneous emissions and mark their location of origin. A timing photodetector 42 detects the spontaneous or other emissions. Photodetectors 42 may include a photo-multiplier tube (PMT), Superconducting Single Photon Detector (SSPD), InGaAs Single Photon Avalanche Diode (SPAD), or other type and preferably include high time resolution, low jitter, low noise, and sufficiently high count rate and signal dynamics.

Characteristics of the photodetector that are highly desirable include: 1. high sensitivity in the wavelength range of the circuit emission (1.0 microns-1.5 microns); 2. high time resolution (low jitter) in detecting the arrival time of the photon compared to a reference triggering signal (few tens of picoseconds, e.g., better (lower) than about 40 ps to 50 ps); 3. low noise (low dark count rate, or false counts not due to photon detections); 4. large signal dynamics (i.e., high count rate capability).

A triggering mechanism 58 from the DUT 14 or external timing generator generates a trigger signal 46 to activate a TCSPC system 44. The trigger signal 46 provides a synchronization mechanism with current operations of the DUT 14 and indicates an instant when an event occurs on the DUT. The TCSPC system 44 receives several inputs. For example, at least a photon arrival signal 56, the trigger input 46, XY scanner position 51 from scanner 20, (and possibly a Z position 53 of the system from a microscope or optical system 54). A database of "events" 52 records the spontaneous emissions detected and the corresponding position from which the emission was detected. The database record may include at least one of the time delay between the photon arrival time (56) and trigger signal (46), and an XY position 51 of the scanner 20 at the time of event. A Z position 53 may also be recorded along the instant in time from the beginning of the measurement.

Operations of system 40 are preferably monitored and controlled using a computer system 57. Computer system 57 is configured with hardware and/or software to provide control signals 55 to control and synchronize operations of, e.g., the scanner 20, optics system 54, photodetector 42, electronics 44, storage in database 52 and/or trigger signal generation. System 57 may also include software for employing the data collected from the DUT 14. The DUT 14 is preferably a powered semiconductor device or circuit. Other DUTs may also be employed. However, the DUT preferably produces emissions on its own by virtue of on-chip events and operations.

A user can interact with computer system 57 using an interface 59 to get time-integrated images, timing waveforms, manipulate the data and analyze the circuit of the DUT 14. The interface 59 may include a graphical user interface and system input devices (e.g., mouse, keyboard, etc.).

Figure 3:
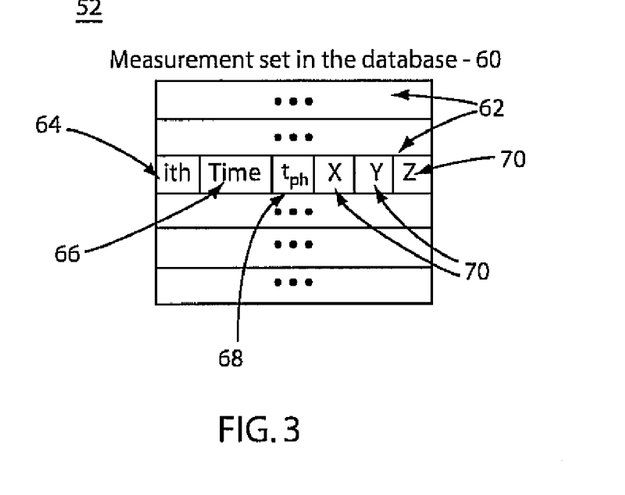
FIG. 3 is an example of a database record entry corresponding to a photon detection event.

Referring to FIG. 3, event records 62 in a measurement set 60 stored in database 52 are illustratively shown. Each record 62 may include an event index field 64. An event time field 66 stores the event time from the beginning of the measurement or time of day (low time precision). A time delay field 68 includes a time delay ($t_{ph}$) of a photon arrival time (56) from the trigger signal (46). This is a high precision time reference. A position of scanner 20 (X,Y) and optics (Z) at the time the photon is detected may be stored in a position field(s) 70. Note that the data stored may be in any suitable format, and that FIG. 3 is merely illustrative of one such format.

Figure 4:
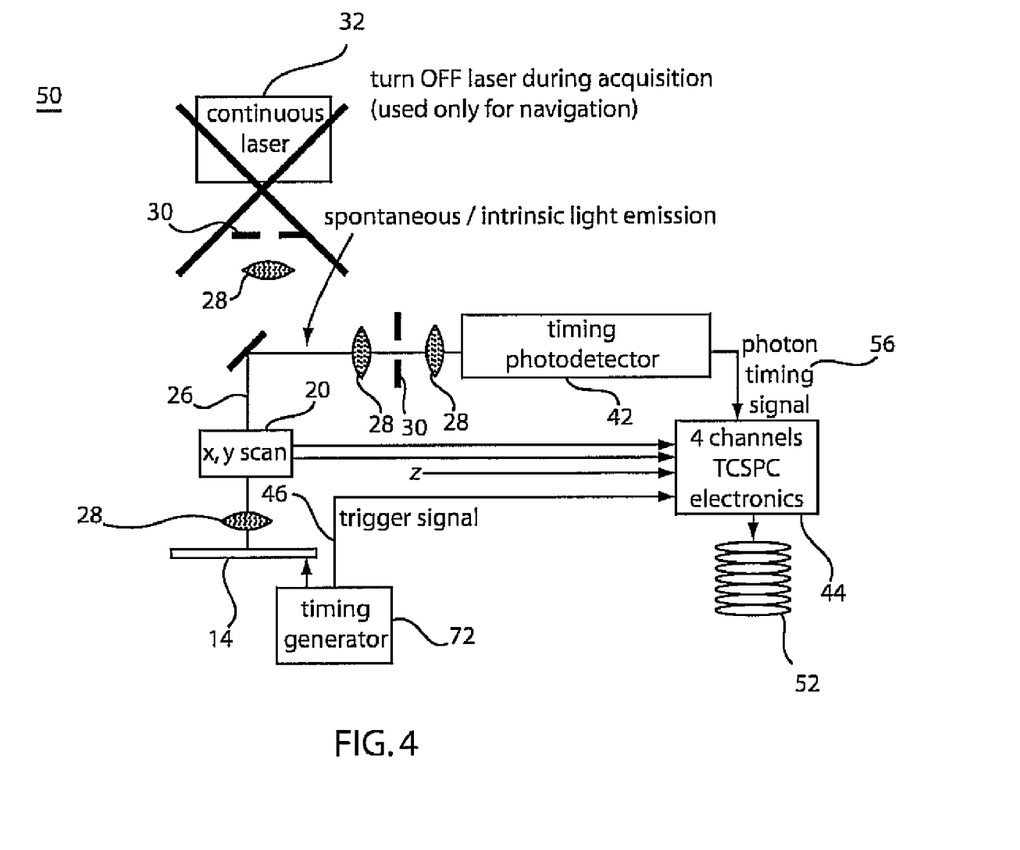
FIG. 4 is a schematic diagram of a Scanning Time-Resolved Emission microscope (S-TRE) during spontaneous emissions measurement using a timing single-pixel photodetector in accordance with one embodiment.

Referring to FIG. 4 with reference to FIG. 1, one embodiment of system 40 includes a configuration 50 similar to the Confocal Laser Scanning Microscope (C-LSM) 10 of FIG. 1. In this configuration 50, a slow detector 24 (FIG. 1) used by the C-LSM 10 to create an image of the reflected laser beam 16 from the DUT 14 is replaced by the timing single-photon detector 42 (FIG. 2). The laser source 32 and C-LSM capability may be used for navigation purposes of the DUT 14 before starting an S-TRE measurement. During TRE measurements, the laser 32 is shut OFF and the scanning system 20 of the C-LSM 10 is used to image an area of the DUT 14 onto the timing photodetector 42. The TCSPC electronics 44 is included to permit for the recording of the photon arrival time and the storage of events into a database 52. In the embodiment shown in FIG. 4, a timing generator 72 is included, which generates a timing signal to provide a reference for determining a delay in the photon measurement.

In one embodiment, the TCSPC electronics 44 takes into account the relative Z position of the optical system to create a 4 dimensional (4D) database of the photon. The data can then be used to create 3D (x, y, t) or 4D (x, y, z, t) (t=time) static and dynamic images of the DUT emission.

Scan speed and pattern can be adjusted to optimize the collection of the emission from different types of devices under test. Furthermore, the speed and pattern could be adjusted dynamically during the S-TRE measurement based on previously acquired data. For example, by spending more time on regions of low emission (to enhance the signal to noise ratio), or to avoid spending time on regions where there is no emission, etc. This step may be done automatically with prefixed algorithms stored in computer system 57 (FIG. 2) or by user intervention during the measurement. The user may notice regions of particular interest that need more attention and use more time scanning these area. In addition, with knowledge of the types and functions of the devices on the DUT 14, a most likely or preferable pattern may be selected (at least initially) based upon historic information or statistics regarding that type of design or structure.

The scanning of the DUT 14 could be performed either in sync or out of synch (asynch) with the trigger signal 46, depending of the application and situation. Compared to a simple mechanical stage translation of the DUT 14 under a conventional microscope, the systems and methods in accordance with the present principles permit for a better rejection of mechanical vibrations and drift. In particular, the resonant oscillation movement of the scanner permits achieving a better repeatability of the acquisition position.

For example, with the present techniques, emission image frames are acquired from an entire region of interest of the DUT 14 in a "short" frame time as compared to the total acquisition time. Many frames are then acquired to account for the entire acquisition time. If from one frame to the next, the DUT has mechanically drifted, mathematical methods implemented in e.g., software on system 57 may be used to correct for the drift. This is difficult when using a stage scanning the DUT 14, because the drift information cannot be extracted since the drift information affects each pixel differently. Another problem related with the creation of images based on stage movement is due to the recent widespread use of Solid Immersion Lens (SIL) optics in modern PICA tools to enhance the collection efficiency and the navigation image quality. The SIL requires direct contact with the sample and therefore the movement from one acquisition point to the next is achieved by "hopping", which unfortunately does not provide good repeatability of the detector positioning.

The photon database 52 may be processed in a way to create time-integrated images of the emission from the DUT 14 using "partial" data at different stages of the acquisition (frames). The comparison of these images permits the observation of mechanical drifts or movement of the DUT 14. The drift can be measured, and the database 52 is processed to correct for the drifts. This could be done at the end of the measurement (post-processing) or during the measurement (real-time).

Figure 5:
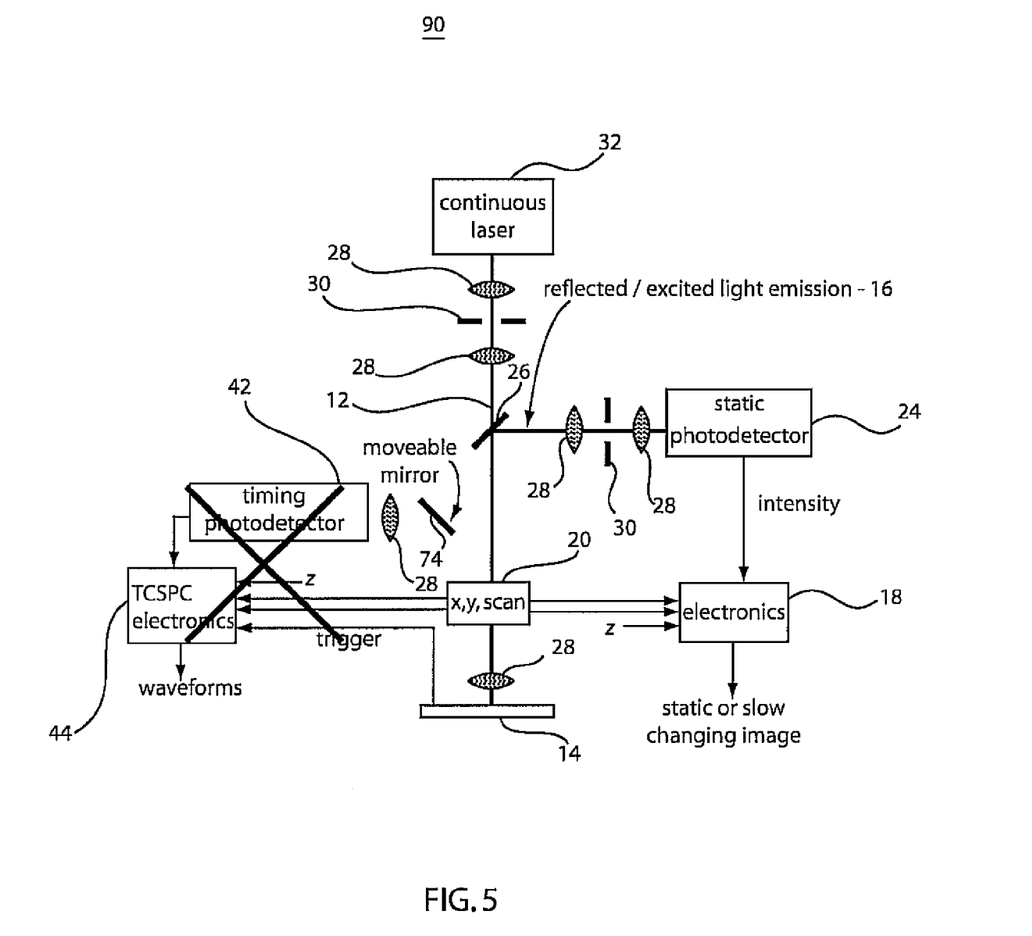
FIG. 5 is a schematic diagram of a Scanning Time-Resolved Emission (S-TRE) system based on a Confocal Laser Scanning Microscope (C-LSM) during a navigation mode where a moveable mirror is retracted out of the optical path.

Referring to FIG. 5, another embodiment shows a PICA system 90 based on the use of a Confocal Laser Scanning Microscope (C-LSM) for circuit navigation having a timing photodetector 42 added thereto. In a first mode, a laser beam 12 is scanned onto the surface of the DUT 14 and the reflected light 16 is collected, separated by a dichroic mirror 26, and detected by a slow photodetector 24 such as a PIN diode, Avalanche Photo Diode (APD) or Photo-Multiplier Tube (PMT). The C-LSM electronics 18 is advantageously employed to locate a start position for the scanning to be performed for the PICA acquisition as will be explained with reference to FIG. 6. Electronics 18 combines the intensity of the reflected light with the instantaneous X,Y position of the scanner 20 to create an intensity image to map the physical features of the DUT 14. Several Z values (i.e., different distances between the DUT 14 and the collection optics) can also be used to create a 3D image of the object.

Figure 6:
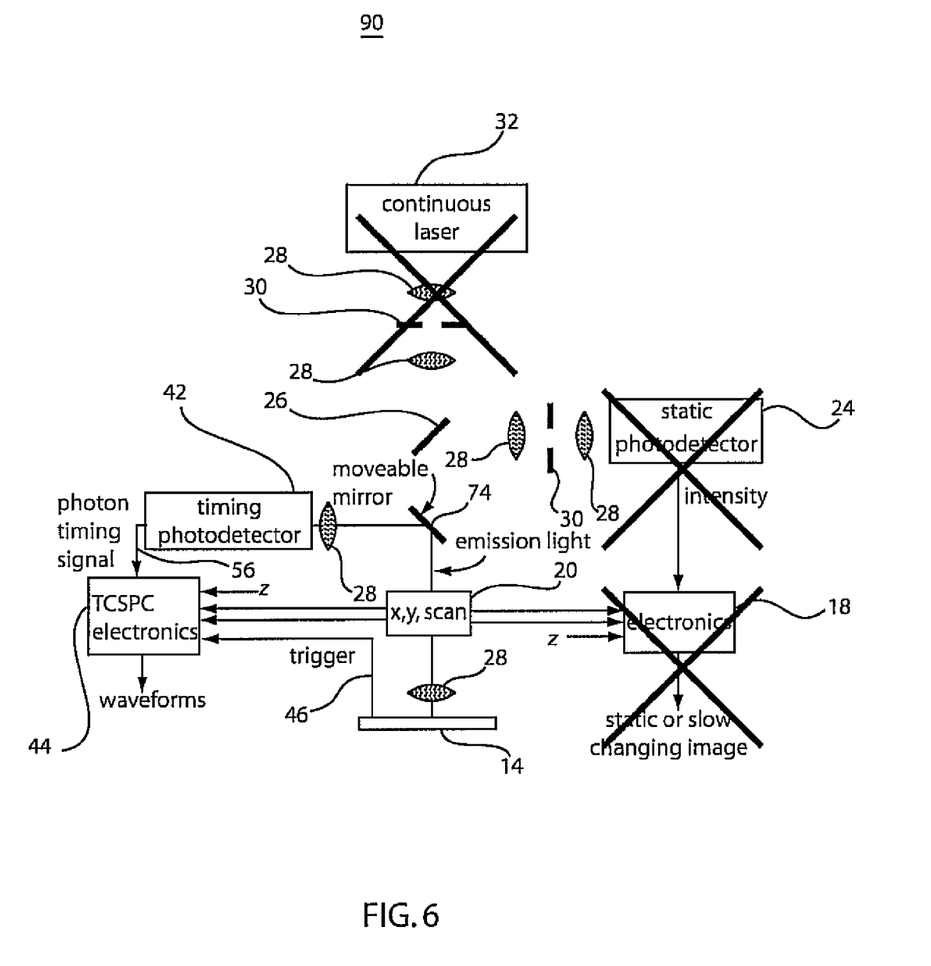
FIG. 6 is a schematic diagram of a S-TRE system based on a Confocal Laser Scanning Microscope (C-LSM) wherein during PICA measurements the laser is turned off and the moveable mirror is inserted to direct the light emitted by the DUT onto a timing photodetector.

To perform PICA measurements with the S-TRE as depicted in FIG. 6, the C-LSM 10 is modified by inserting the X,Y scan system 20 between the moveable mirror 74 and the DUT. The mirror 74 is out of the beam during navigation (FIG. 5) in the navigation mode. However, after navigation (FIG. 5), emission measurements are made as described with reference to FIG. 6.

Referring to FIG. 6, emission measurements are made after turning off the laser source 32 in a PICA mode. The X,Y scanner 20 stays enabled, and the moveable mirror 74 is inserted into the optical path to direct the emission from the DUT 14 onto the PICA photodetector 42. The Time Correlated Single Photon Timing (TCSPC) electronics 44 receives the photon signal 56 from the photodetector 42, and the trigger signal 46 from the circuit or timing generator and reconstructs a histogram of the photon arrival times.

One aspect of the present embodiments includes using a scanning system 20 (such as the scanning capability of the C-LSM 10, FIG. 1) to create an image of the emission collected from the DUT 14 by using a single pixel photodetector. If the Scanning Time-Resolved Emission (S-TRE) system 40 is implemented in a C-LSM 10 (see e.g., FIG. 4), the LSM low speed photodetector 24 may be replaced with or switched out in favor of a timing photodetector 42 that is capable of precisely measuring the arrival time of single-photon with picosecond precision.

Scanning Time-Resolved Emission microscopes (S-TRE) (microscopes/systems 40, 50, 90) are shown in accordance with illustrative embodiments. The single-photon detectors may be used in a counting/integrating mode during navigation mode (e.g., FIG. 5) where the LSM 10 behaves as in FIG. 1. In this mode, during the PICA measurements, the laser source 32 is turned off while the XY scanner 20 is used to direct light emitted from different areas of the DUT 14 onto the single-photon detector 42. This permits the removing of imaging requirements from the photodetector thus allowing the optimization of the performance of the single-pixel detector for very high detection efficiency, low dark count rate (noise), and high time resolution.

Compared to a single point acquisition, this scanning technique has the disadvantage of causing an increase in the total image acquisition time, which is proportional to the number of pixels. Such a disadvantage is however very minimum given the elevated sensitivity of present single-pixel detector and the long list of previously mentioned advantages of imaging capability. The XY scanning range can also be adapted to cover different areas of the circuit and change the number of collected pixels.

Figure 7:
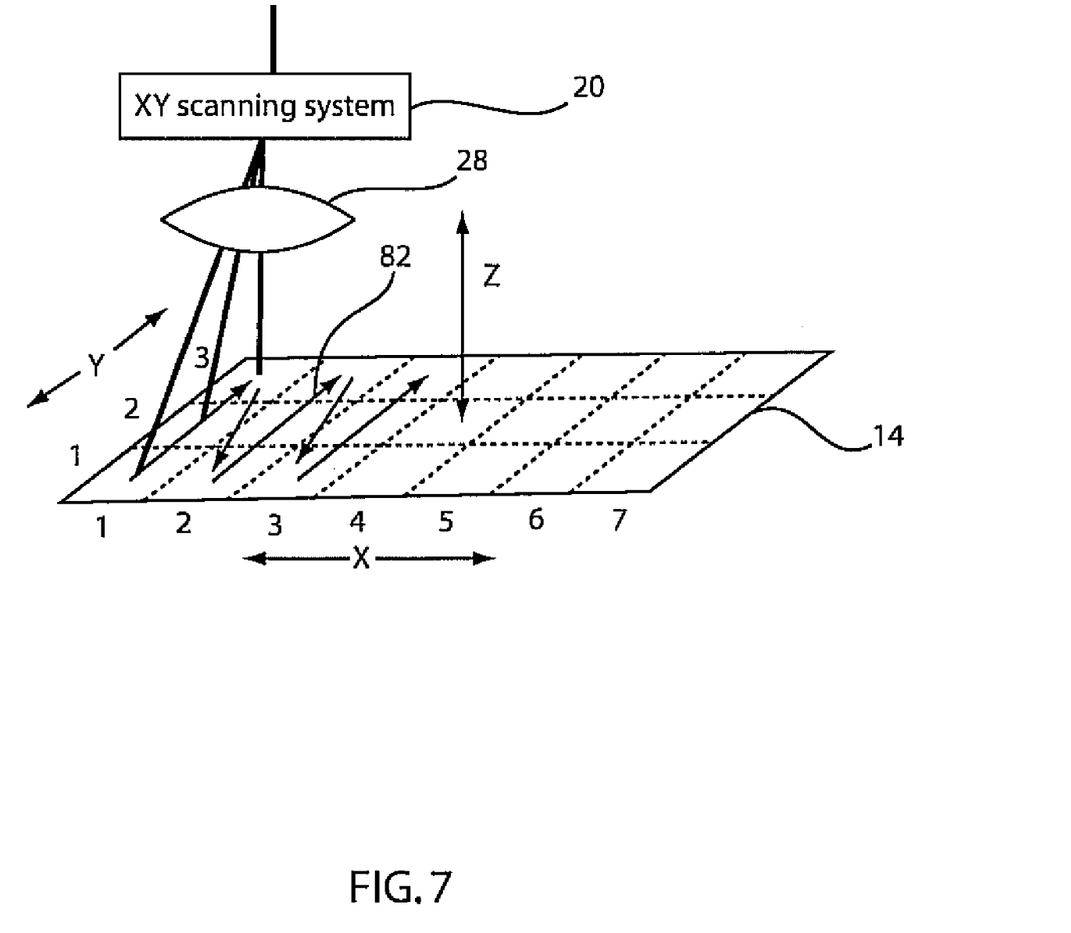
FIG. 7 is a schematic example showing the scanning of a surface of the DUT for collecting light emission.

Referring to FIG. 7 with continued reference to FIGS. 2, 4, and 6, a scanning procedure is illustratively shown to collect the spontaneous light emission from a DUT 14. When the scanning system 20 is activated, light emission from different portions of the DUT 14 can be collected, depending on the position of the XY scanner 20. Assume that the scanner 20 is in position (1,1) for a time T11. If a photon is detected in this time window by the timing photodetector 42, the TCSPC electronics 44 will measure its time separation $t_{ph}$ compared to the trigger signal 46 and create a database entry 60 to record with the calculated $t_{ph}$, the XY location (1,1) and possibly the z position of the optics as well as the time from the beginning of the measurement. Independently from the fact that zero, one or more photons have been detected, after the time T11, the scanner 20 will move to a next position, say (1,2) and wait there for a time T12 (that may or may not be the same as T11). Again, if photons are detected in this position, they will be labeled (1,2) in the database 52. The scanner 20 moves along all the positions of the DUT 14 and then repeats the cycle or pattern 82 from (1,1). The positions may be changed during the acquisition, some of the pixels may be ignored or the time spent on the pixel may depend on previous acquired data. In other words, the patterns 82 can be modified depending on historical data, knowledge of the DUT design, or other criteria.

The TCSPC electronics 44 receives a photon signal 56 from the photodetector 42, a trigger signal 46 from the DUT 14 or from the timing generator 72, and the actual XY position from the scanner 20. Each photon is therefore associated with its time delay from the trigger along with the pixel in the image. A multi-channel analyzer or PC 57 can then be used to plot the data in many different ways, among them, for example: (1) movies; (2) time-integrated images of the emission, in which only the information associated with the spatial coordinates of the photon is used while the arrival time is neglected; (3) timing waveforms of portions of the acquired image; (4) different types of pixel integration and selection based on the DUT layout; and (5) any other display format or image.

For each pixel, a timing waveform of the emission can be constructed by selecting only the database records with the specified XY location and creating a histogram of the arrival time of the photons compared to the trigger. Different pixels can also be associated and their data merged to improve the signal-to-noise ratio, by reducing the spatial resolution. In addition, if the timing information of the database records is ignored, a time-integrated image (frame) of the emission can be constructed, for example using the intensity of each pixel of the image corresponding to the number of photons detected with the scanner in that position. Creating many different frames, corresponding to different successive time windows in the acquired data, can then be used to generate a movie.

Assuming that, if averaged over a long time period, the emission from the DUT does not change, time-integrated images extracted at different moments in time during a long acquisition time should look the same (with the exception of noise in the images). Therefore, this comparison can be used to detect mechanical drift of the system, calculate the amount of drift and correct for the drift by modifying the XY location of the photons detected after the drift has taken place.

The system in accordance with present principles is compatible with cooling technologies (spray, air, diamond window) as well as Solid and Liquid Immersion Lenses to enhance the optical Numerical Aperture of the microscope and therefore reduce the acquisition time. Adaptive algorithms could also be used to give higher exposure time to some of the pixels of the images depending on the previously acquired photons during the same acquisition, thus permitting a possible reduction of the acquisition time. The scan area could also be changed during the acquisition through user intervention.

Figure 8:
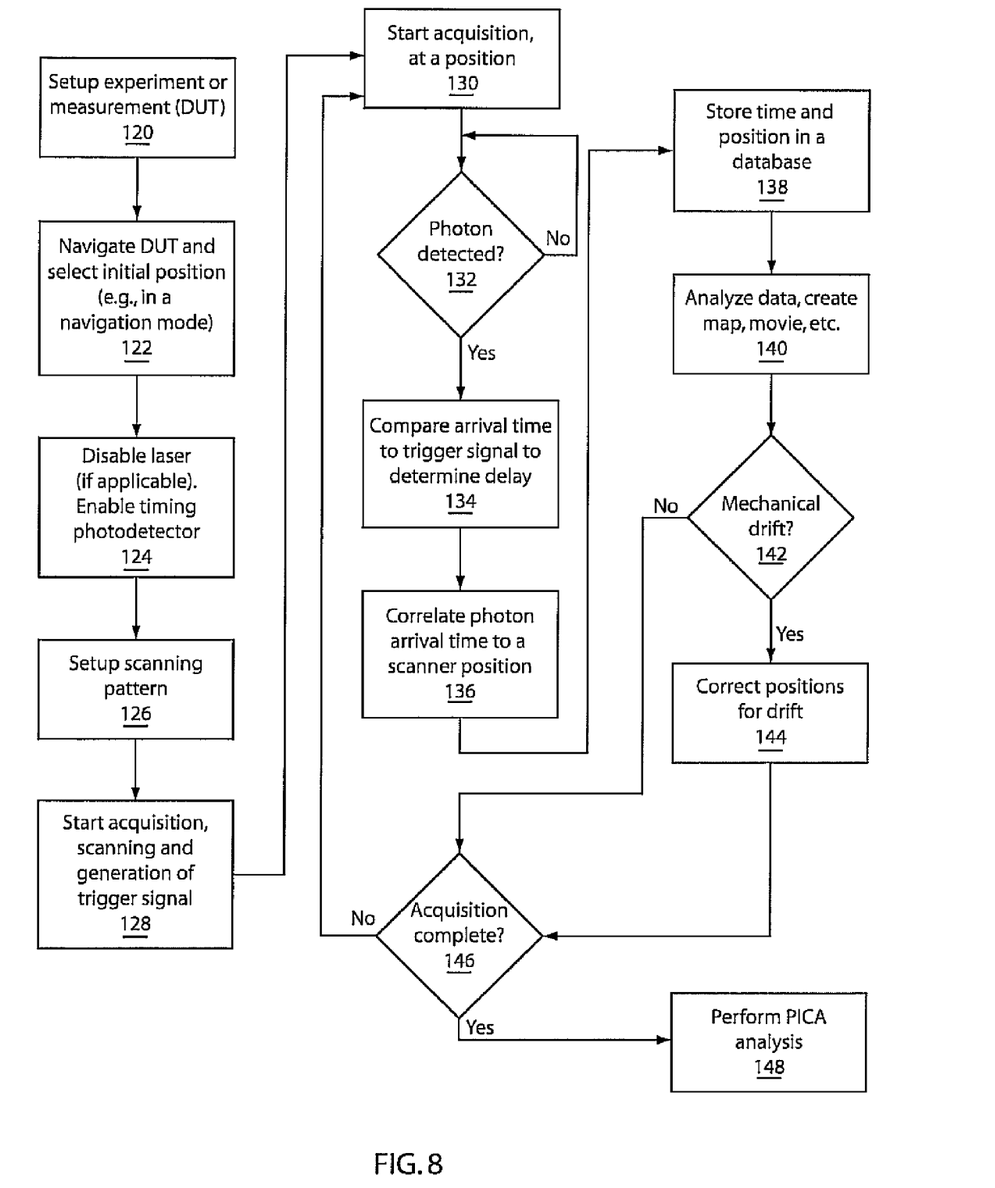
FIG. 8 is a flow diagram showing an illustrative method for Scanning Time-Resolved Emission microscope (S-TRE) emission measurements.

Referring to FIG. 8, a method for Picosecond Imaging for Circuit Analysis (PICA) using a Scanning Time-Resolved Emission (S-TRE) microscope is illustratively shown. In block 120, an experiment or measurement is set up. This includes setting up a device under test (DUT). In block 122, the DUT is navigated (e.g., using a navigation mode or navigation capability of a system) to select an acquisition position. The navigation may be set up using for example, a scanning device of a C-LSM. In block 124, if present, a laser source (for navigation, etc.) is turned off and a timing detector is enabled to perform emissions measurements.

In block 126, a scanning pattern is set up. The pattern may be adjusted or customized based on statistical information, the DUT design, historical data and/or any other information. The scan pattern may include parameters such as the area to be scanned, number of pixels, time per pixel, etc. In block 128, an initial acquisition is begun. This is followed by scanning to a new location. Trigger signal generation is also provided.

In block 130, acquisition at a particular location is conducted. In block 132, a determination is made of whether a photon from spontaneous or other light emissions from the DUT is detected using a timing photodetector capable of single photon detection, preferably a single photon, single point photodetector. If no photon is detected, the path continues the acquisition step until the predetermined acquisition time is exceeded.

If a photon is detected, in block 134, the photon arrival time is compared with the trigger signal to compute delay. In block 136, scanner position and the photon arrival time are correlated. In block 138, the position, and times for the photon are stored in a database.

The following steps may be performed after a single acquisition, group of acquisitions or as post-processing. In block 140, the data collected for the photon is analyzed or employed to be displayed in e.g., an intensity map, movie, etc. In block 142, mechanical drift is evaluated by a user or using software. If mechanical drift is determined, the photon positions are corrected for the drift in block 144. In another embodiment, the mechanical drift is evaluated during the measurement and not at the end. Otherwise, a determination of whether the acquisition procedure is complete at the present location is made in block 146. This determination may be made by the user, software or other criteria.

If the acquisition is finished, a PICA or other analysis of the photon data may be made. This may include circuit analysis on integrated circuits or other devices or samples having spontaneous or intrinsic light emissions. Otherwise, the path returns to block 130 for acquisition at a next location.

In one embodiment, an S-TRE is provided on a Laser Scanning Microscope, and the method further includes directing emissions toward the timing photodetector using a moveable mirror or other device. The moveable mirror is moved out of the optical path during a navigation mode when the scanning system of the laser scanning microscope defines a position. Then the moveable mirror is moved into the optical path to collect and redirect spontaneous or other emissions (laser is off) to the timing photodetector.

Having described preferred embodiments of a method and apparatus for creating time-resolved emission images of integrated circuits using a single-point single-photon detector and a scanning system (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A Scanning Time-Resolved Emission (S-TRE) microscope, comprising:
   a laser source for navigation;

an optical system configured to collect light from emissions generated from a device under test (DUT), where the optical system includes a moveable mirror configured to redirect spontaneous emissions from the DUT and further configured to be out of an optical path of the laser source during navigation;

a scanning system configured to permit the emissions of light to be collected from positions across the DUT in accordance with a scan pattern;

a triggering signal, generated from one of the DUT and an external timing generator when an event occurs on the DUT, that is configured to indicate an instant when an event occurs on the DUT; and a timing photodetector, optically coupled to the scanning system, that is configured to detect a single photon or photons of the emissions of light from the particular positions across the DUT such that the emissions of light are correlated to the positions using the triggering signal to create a time-dependent map of the emissions of light across the DUT.

2. The microscope as recited in claim 1, further comprising a triggering signal generated from one of the DUT and an external timing generator which indicates an instant when an event occurs on the DUT.

3. The microscope as recited in claim 1, further comprising a time correlated single photon counting (TCSPC) system configured to receive information regarding the particular positions from the scanning system and correlate the position to a detected photon or photons.

4. The microscope as recited in claim 3, wherein the TCSPC system receives a photon arrival signal from the photodetector and a trigger signal and determines a delay time between the photon arrival signal and the trigger signal to provide a time for the occurrence of the light emission.

5. The microscope as recited in claim 1, wherein the scanning system measures X and Y positions and the optical system measures a Z position for the DUT.

6. The microscope as recited in claim 1, further comprising a database configured to store events associated with the emissions.

7. The microscope as recited in claim 6, wherein the events include at least one of a time delay between a photon arrival time and a trigger signal, and an XY position of the scanning system at the time of the event.

8. The microscope as recited in claim 7, wherein the events include a Z position of the DUT.

9. The microscope as recited in claim 1, wherein the microscope is adapted to perform Picosecond Imaging for Circuit Analysis (PICA).

10. A Scanning Time-Resolved Emission (S-TRE) microscope, comprising:
 a laser source for navigation;
 an optical system configured to collect light from spontaneous emissions of light from a device under test (DUT), where the optical system includes a moveable mirror configured to redirect spontaneous emissions from the DUT and further configured to be out of an optical path of the laser source during navigation;
 a scanning system configured to permit the spontaneous emissions of light to be collected from particular positions across the DUT in accordance with a scan pattern;
 a triggering signal generated from one of the DUT and an external timing generator when an event occurs on the DUT configured to indicate an instant when an event occurs on the DUT;
 a timing photodetector configured to receive the spontaneous emissions of light from the scanning system and detect a single photon or photons of the spontaneous emissions of light from the particular positions across the DUT such that the spontaneous emissions of light are correlated to the positions; and
 a time correlated single photon counting (TCSPC) system configured to receive the particular position information from the scanning system and correlate the position to a detected photon or photons, wherein the TCSPC system receives a photon arrival signal from the photodetector and the trigger signal and computes a delay between the photon arrival signal and the trigger signal to determine a time for the occurrence of the spontaneous light emission.

11. The microscope as recited in claim 10, wherein the scanning system measures X and Y positions and the optical system measures a Z position for the DUT.

12. The microscope as recited in claim 10, further comprising a database configured to store events associated with the spontaneous emissions.

13. The microscope as recited in claim 12, wherein the events stored in the database are employed to create a map of the spontaneous emissions of light across the DUT.

14. The microscope as recited in claim 12, wherein the events include at least one of a time delay between a photon arrival time and a trigger signal, and an XY position of the scanning system at the time of the event.

15. The microscope as recited in claim 14, wherein the events include a Z position of the DUT.

16. The microscope as recited in claim 10, wherein the microscope is adapted to perform Picosecond Imaging for Circuit Analysis (PICA).

17. A laser scanning microscope adapted to be a Scanning Time-Resolved Emission Microscope (S-TRE), comprising:
 a navigation mode, including:
  an active laser source;
  a first optical system configured to direct light to a device under test (DUT), collect and redirect light from excited emissions of light from the device under test (DUT);
  a scanning system configured to position the first optical system to permit the excited emissions of light to be collected from particular positions across the DUT;
  a static photodetector configured to detect the excited emissions of light from the particular positions across the DUT to determine an initial position on the DUT; and
  a moveable mirror configured to be out of an optical path of the laser beam during the navigation mode;
 and, a Picosecond Imaging for Circuit Analysis (PICA) mode, including:
  the moveable mirror positioned in the optical path to redirect spontaneous emissions from the DUT;
  a second optical system configured to collect light from the spontaneous emissions of light from the moveable mirror; and
  the scanning system configured to position the second optical system to permit the spontaneous emissions of light to be collected from particular positions across the DUT in accordance with a scan pattern based on at least one of statistical information, the DUT design, and historical data;
  a timing photodetector configured to detect a single photon or photons of the spontaneous emissions of light from the particular positions across the DUT such that the spontaneous emissions of light are correlated to the positions to create a map of the spontaneous emissions of light across the DUT.

18. The microscope as recited in claim 17, further comprising a triggering signal generated in the PICA mode from one of the DUT and an external timing generator which indicates an instant when an event occurs on the DUT.

19. The microscope as recited in claim 17, further comprising a Time Correlated Single Photon Counting (TCSPC) system configured to receive the particular position information from the scanning system and correlate the position to a detected photon or photons.

20. The microscope as recited in claim 19, wherein the TCSPC system receives a photon arrival signal from the timing photodetector, receives a trigger signal and compares the photon arrival signal to the trigger signal to determine a delay therebetween for determining a time of occurrence of the spontaneous light emission.

21. The microscope as recited in claim 17, wherein the scanning system measures X and Y positions and one of the first and second optical systems measures a Z position for the DUT.

22. The microscope as recited in claim 17, further comprising a database configured to store events associated with the spontaneous emissions.

23. The microscope as recited in claim 22, wherein the events include at least one of a time delay between a photon arrival time and a trigger signal, and an XY position of the scanning system at the time of the event.

24. The microscope as recited in claim 23, wherein the events include a Z position of the DUT.

25. The microscope as recited in claim 17, wherein the navigation mode is employed to determine an initial start position relative to the DUT and the Picosecond Imaging for Circuit Analysis (PICA) mode is employed to measure the spontaneous emissions.

26. A method for Picosecond Imaging for Circuit Analysis (PICA) using a Scanning Time-Resolved Emission (S-TRE) microscope, comprising:
navigating with a laser source;
operating a device under test (DUT) such that the DUT produces light emissions;
directing spontaneous emissions from the DUT with a moveable mirror that is configured to be out of an optical path of the laser source during navigation detecting light emissions from the DUT at a position of a scanning system using a timing photodetector capable of single photon detection;
correlating the position of the scanning system to the light emissions detected at that position;
storing correlated position and light emission counts in a record; and
collecting the emissions from a new position of the scanning system where the new position is determined in accordance with a scan pattern.

27. The method as recited in claim 26, further comprising generating an intensity map based on the records.

28. The method as recited in claim 26, further comprising determining a mechanical drift of the DUT and modifying the correlated position accordingly.

29. The method as recited in claim 26, wherein correlating includes employing a time correlated single photon counting (TCSPC) system to associate the position with a photon count.

30. The method as recited in claim 26, further comprising:
generating a trigger signal from one of the DUT and an external timing generator which indicates an instant when an event occurs on the DUT;
generating a photon arrival signal from the timing photodetector; and
comparing the photon arrival signal to the trigger signal to determine a delay therebetween to determine a time for the occurrence of the light emission.

31. The method as recited in claim 26, wherein storing includes storing in the record at least one of a time delay between a photon arrival time and a trigger signal, and a position of a scanning system at the time of an event.

32. The method as recited in claim 31, wherein the scanning system measures X and Y positions and an optical system measures a Z position for the DUT.

33. The method as recited in claim 26, further comprising performing a Picosecond Imaging for Circuit Analysis (PICA).

34. The method as recited in claim 26, wherein the S-TRE is provided on a scanning laser microscope, and the method further comprising directing emissions generated by the DUT toward the timing photodetector using a moveable mirror.

* * * * *